(12) United States Patent
Mitteregger

(10) Patent No.: US 6,838,929 B2
(45) Date of Patent: Jan. 4, 2005

(54) INTEGRATED CIRCUIT ARRANGEMENT COMPRISING AN ACTIVE FILTER AND A METHOD FOR TUNING AN ACTIVE FILTER

(75) Inventor: Gerhard Mitteregger, Taufkirchen (DE)

(73) Assignee: Xignal Technologies AG, Unterhaching (DE)

( * ) Notice: Subject to any disclaimer, the term of this patent is extended or adjusted under 35 U.S.C. 154(b) by 57 days.

(21) Appl. No.: 10/429,962

(22) Filed: May 6, 2003

(65) Prior Publication Data

US 2004/0085123 A1 May 6, 2004

(30) Foreign Application Priority Data

May 7, 2002 (DE) ........................................ 102 20 332

(51) Int. Cl.[7] .................................................. H03K 5/00
(52) U.S. Cl. .................................................... 327/553
(58) Field of Search ......................... 327/103, 551–559

(56) References Cited

U.S. PATENT DOCUMENTS

| | | | | |
|---|---|---|---|---|
| 5,617,052 A | | 4/1997 | Kimura | 327/356 |
| 5,621,358 A | | 4/1997 | Pisati et al. | 330/253 |
| 6,140,867 A | * | 10/2000 | de Micheli et al. | 327/553 |
| 6,172,569 B1 | * | 1/2001 | McCall et al. | 330/303 |
| 6,512,414 B2 | * | 1/2003 | Yokoyama et al. | 327/553 |
| 6,538,498 B2 | * | 3/2003 | Lee et al. | 327/553 |

FOREIGN PATENT DOCUMENTS

DE          694 27 471 T2    4/2002

OTHER PUBLICATIONS

Silva–Martinez Jose et al., "High–Performance CMOS Continuous–Time Filters", Kluwer Academic Publishers, The Kluwer International Series In Engineering and Computer Science, May 1993, ISBN 0–7923–9339–2, pp. 122–127.

* cited by examiner

*Primary Examiner*—Dinh T. Le
(74) *Attorney, Agent, or Firm*—Rothwell, Figg, Ernst & Manbeck, P.C.

(57) ABSTRACT

The invention relates to an integrated circuit arrangement with an active filter comprising transconductance stages, each being adjustable by means of a bias current to be supplied, and comprising a tuning device for tuning the filter, which tuning device adjusts the bias currents of the transconductance stages, wherein the tuning device adjusts the bias current of a first transconductance stage, for the purpose of achieving a desired characteristic of this transconductance stage, and adjusts the bias current of at least one further transconductance stage such that the transconductance of this further transconductance stage deviates from the transconductance of the first transconductance stage by a certain value.

7 Claims, 3 Drawing Sheets

INTEGRATED CIRCUIT ARRANGEMENT COMPRISING AN ACTIVE FILTER AND A METHOD FOR TUNING AN ACTIVE FILTER

BACKGROUND TO THE INVENTION

1. Field of the Invention

The invention relates to an integrated circuit arrangement with an active filter as well as a method for tuning an active filter.

2. Description of the State of the Art

Integrated circuit arrangements with an active filter are known comprising transconductance stages, each of which can be adjusted by means of a bias current which is to be supplied.

The so-called gm/C filters, in which, apart from transconductance stages, capacitors are also arranged, constitute an important category of active filters. Among other things, gm/C filters are used for broadband filtering (anti aliasing filters), in conjunction with equalisers in digital transmission technology, or in continuous time sigma-delta converters. Without feedback, they are generally used in applications with high bandwidths and medium linearity requirements.

The circuit shown in FIG. 1 shows a structure, which in the literature is referred to as a "biquad", implemented in gm/C technology with the following transmission function A(s):

$$A = \frac{U_{out}}{U_{in}} = \frac{\frac{gm_1 * gm_2}{C_1 * C_2}}{s^2 + \frac{gm_4}{C_1} * s + \frac{gm_2 * gm_3}{C_1 * C_2}} = \frac{\omega_0^2}{s^2 + \frac{\omega_0}{Q} * s + \omega_0^2}$$

with:
- s=complex frequency
- ω0=pole frequency
- Q=pole quality

In the above arrangement, C1, C2 and gm1, gm2, gm3, gm4 refer to the capacity of the capacitors shown in FIG. 1, or to the transconductance of the transconductance stages shown in FIG. 1. The circuit is an improvement on, or a special design of, a circuit described in Silva-Martinez, José, "High-Performance CMOS continuous-time filters", Kluwer Academic Publishers, ISBN 0-7923-9339-2 (compare FIG. 4.1. of this publication).

In practical application, biquad filters are important basic modules for forming active filters, since, with a suitable combination of biquad structures, any desired filter characteristic can be achieved and the position of zeroes and poles in the complex s-plane of biquad structures is influenced to a relatively low degree by variations in the electrical properties of the components used. Precise control of the position of zeroes and poles in the complex s-plane is a prerequisite for the designed filter to meet the prescribed specifications. In this regard, variations in the component characteristics due to process fluctuations during the production of the integrated circuit, as well as due to temperature fluctuations during operation of said integrated circuit, are particularly important.

The design and mode of operation of transconductance stages, such as the stages gm1 to gm 4 in FIG. 1, are well known to the average person skilled in the art. In a nutshell, a transconductance stage, also known as an operational transconductance amplifier (OTA), transconductance element or transconductor, is a device for generating a current signal from a voltage signal that has been input. This is shown in FIG. 1a with reference to the transconductance stage gm1. If the voltage present at the input of the stage is designated Uin, and the current flowing at the output of the stage is designated Iout, then the following applies:

$$Iout = gm1 * Uin,$$

wherein gm1 designates the so-called transconductance gain or the transconductance of the device. Usually, the transconductance of a transconductance stage is adjusted by means of a bias current (Itun in FIG. 1a) supplied to the stage, wherein the concrete interrelation between the bias current and the resulting transconductance depends on the actual design of the transconductance stage. Within the scope of this invention it is of importance that, with a given design of the transconductance stage, its transconductance changes if the bias current is changed, i.e. gm=gm (Itun).

For the purpose of adjusting the bias currents of transconductance stages of an active filter, known integrated circuit arrangements also comprise a tuning device for tuning the filter, with said tuning device adjusting the bias currents of the individual transconductance stages and thus the individual transconductance values. During this adjustment, the above-mentioned variations in transconductance due to fluctuations in the production process and fluctuations in the temperature can be compensated for. Tuning devices and strategies for automatic chip-integrated adjustment of a filter are known per se. Such a strategy for example consists of measuring the present filter performance characteristics, and subsequently comparing these performance characteristics with a standard (reference), and subsequently determining a deviation between the present performance characteristics and the reference, and finally calculating a correction signal and supplying it to the filter. By iterative implementation of this method, deviations (errors) can be reduced. To avoid any impairment of filter operation, the present filter performance characteristics can be measured indirectly, at a replica of the filter or parts of the filter, instead of at the filter itself. To this effect it must only be ensured that the behaviour of the replicated filter or of the replicated filter components corresponds to the behaviour of the filter or of the filter components. This condition is met for replicas which are arranged near the filter, on the same chip.

It is thus advantageous, for the purpose of adjusting the filter, to define bias currents for transconductance stages on replicated filters or filter components, with said bias currents subsequently being supplied to the transconductance stages of the filter, either directly or indirectly by means of current mirrors which are known per se.

In FIG. 1, the tuning device for adjusting the transconductance stages is not shown.

If in the filter according to FIG. 1, one takes into account the output resistance, which in practical application exists for every transconductance gm in the form of an output admittance gds (compare FIG. 2), then both the pole frequency and the pole quality change. The filter characteristic or transmission function A(s) no longer corresponds to that where the output resistance has not been taken into account; a situation which generally speaking is disadvantageous.

Known remedies include increasing the output resistance of the transconductance (gain boosting) or implementing negative output resistance which corresponds to the output resistance.

Increasing the output resistance by way of gain boosting means using operational amplifiers or transistors in feedback loops. In the case of high frequencies, the effect of these loops is limited. Furthermore, the output resistance can only be increased, but its effect on the filter characteristics cannot be eliminated.

In theory, the use of negative resistance can fully compensate for the output resistance. However, implementing the very small regulatable transconductance which is necessary for this is very difficult. Furthermore, additional tuning is required in order to regulate the negative resistance to be equal to the output resistance by way of fluctuations in temperature and process. Moreover, the negative resistance implemented by a transconductance exposes the circuit nodes to undesirable capacitance.

OUTLINE OF THE INVENTION

It is the object of the invention to provide an integrated circuit arrangement of the type described above, and to provide a method for tuning an active filter of such a circuit arrangement, in which the effect which output admittance values of transconductance have on the filter characteristics in practical application can be compensated for to a large extent.

This object is met by providing an integrated circuit arrangement as well as a method in which the bias current of a first transconductance stage, for the purpose of achieving a desired characteristic of this transconductance stage, is adjusted and in which the bias current of at least one further transconductance stage is adjusted by means of a special closed-loop control circuit. The dependent claims relate to advantageous embodiments of the invention which can be used individually or, particularly advantageously, in combination.

The invention makes it possible to change the transconductance of the filter in such a way that the influence of the output resistance of the transconductance on the desired transmission function (e.g. the above-mentioned transmission function of the filter according to FIG. 1) is more or less cancelled out. In particular, the invention makes it possible to compensate for the effect the output resistance of the transconductance has on the transmission function of a gm/C filter by suitably changing certain transconductance values in the filter in relation to transconductance values which were determined when the filter was designed, without taking into account the output resistance. To this effect, the transconductance stage of at least one gm/C unit is subjected to main tuning or main tweaking, during which the time constant gm/C is adjusted to a desired value, while in contrast, by means of additional tuning or tweaking, the transconductance stage of at least one further gm/C unit is adjusted such that the transconductance of this further transconductance stage deviates from the transconductance of the transconductance stage adjusted during main tuning by a value which corresponds to the sum of several of the output admittance values.

At any rate, the output resistance values for the individual transconductance stages are identical if the filter is designed such that the design and the transconductance value of the individual transconductance stages are identical. However, in the case of different transconductance values, a practically uniform output admittance of the transconductance stages results, which output admittance essentially only depends on the production technology used. If the individual output resistance values are essentially the same, then the notion "sum of several output admittance values" denotes a multiple of this uniform output admittance.

The bias current to be supplied to the further transconductance stages, for the purpose of this additional tuning, is defined at a closed-loop control circuit which comprises an arrangement of replicas. Said bias current can then be supplied to the respective transconductance stage of the filter either directly or indirectly via a current mirror.

The compensation of the effect the output resistance of transconductance values has on the transmission function of a filter is explained in detail below, using the example of the gm/C filter according to FIGS. 1 and 2. p In a preferred embodiment, the active filter is a gm/C filter, in particular a biquad gm/C filter.

Furthermore, it is preferred if the circuit arrangement is constructed in CMOS technology.

For the case of uniform output admittance (of several and in particular of all the transconductance stages), the tuning device can be designed in a simple way if the tuning device adjusts the bias current of the further transconductance stages such that the transconductance of this further transconductance stage differs from the transconductance of the first transconductance stage by an integral multiple of this uniform output admittance. There is also a simple design of the tuning device if the closed-loop control circuit comprises a series arrangement of replicas of the first transconductance stage and of the further transconductance stage, wherein the input of the first transconductance stage constitutes the input of the arrangement, wherein the output of the first transconductance stage is connected to the input of the further transconductance stage as well as to the output of the further transconductance stage, and wherein the output of the further transconductance stage constitutes the output of the arrangement.

In order to carry out additional tuning as quickly and reliably as possible, the current source for supplying the regulated further bias current to the replica of the further transconductance stage comprises two current-source units with a parallel feed arrangement, with the first of these units supplying a bias current component which is at a fixed ratio to the first bias current; wherein the comparison signal is supplied to a second unit for supplying a regulated bias current component.

BRIEF DESCRIPTION OF THE DRAWINGS

Below, the invention is described in more detail by means of one exemplary embodiment, with reference to the drawings enclosed.

The following are shown.

DESCRIPTION OF THE PREFERRED EMBODIMENT(S)

Figure 1:
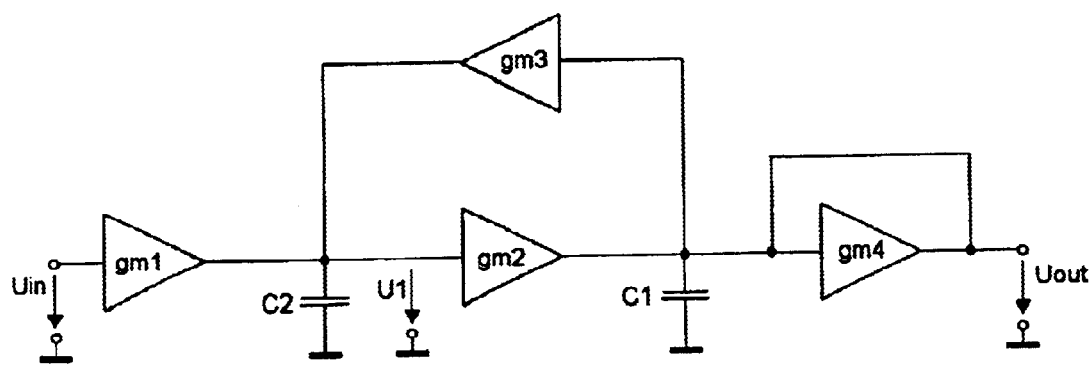
FIG. 1 a circuit diagram of a biquad gm/C filter.
Figure 1A:
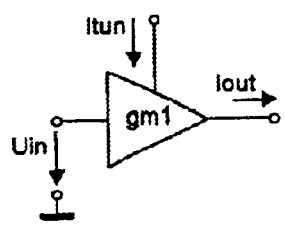
FIG. 1*a* a detail from the circuit diagram according to FIG. 1 which shows the function of one of the transconductance stages shown in FIG. 1.

FIGS. 1 and 1*a* have already been explained above as an embodiment of an active filter comprising transconductance stages gm1 to gm4. Apart from these transconductance stages, the filter comprises capacitors C1 and C2 as shown in FIG. 1. This is thus a biquad gm/C filter in which an input voltage Uin is introduced at the input of a first transconductance stage gm1, and an output voltage Uout is provided at the output of one of the further transconductance stages (gm2, gm3, gm4), namely the transconductance stage gm 4.

FIG. 1a shows the function of the transconductance stage gm1. The transconductance gm1 of this stage is adjusted by a bias current Itun which is provided by a tuning device (not shown in FIG. 1a) and is adjusted during main tuning of the filter, for example to achieve a desired time constant gm1/C2 of the gm/C unit (integrator) constituted by the transconductance stage gm1 and the capacitor C2.

Figure 2:
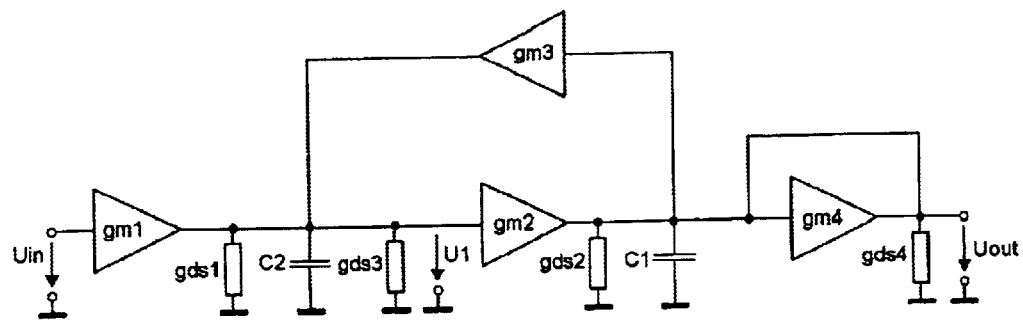
FIG. 2 a circuit diagram of the gm/C filter according to FIG. 1, wherein the output resistance values of the transconductance stages have been taken into account.

FIG. 2 shows the gm/C filter, taking into account output resistance in the form of output admittance values gds1, gds2, gds3 and gds4 at the outputs of the transconductance stages gm1 to gm4. Compared to the transmission function A(s) of the gm/C filter according to FIG. 1, as already explained above, with realistic assessment of the filter according to FIG. 2, both the pole frequency and the pole quality are changed.

With the simplification, usually justified in practical application, of $$gds_1 = gds_2 = gds_3 = gds_4 = gds \text{ (uniform output admittance)}$$

we arrive at the following transmission function A(s) of the filter of FIG. 2:

$$A = \frac{U_{out}}{U_{in}} = \frac{\frac{gm_1 * gm_2}{C_1 * C_2}}{s^2 + \left(\frac{gm_4 + 2*gds}{C_1} + \frac{2*gds}{C_2}\right) * s + \frac{gm_3 * gm_2 + 2*gds*gm_4 + 4*gds^2}{C_1 * C_2}}$$

According to the invention, the undesirably strong dependence of this transmission function A(s) on the output admittance gds can be reduced by a particular adjustment of the transconductance stages gm2 to gm4 for creating new transconductance values as follows:

$$gm_{2neu} = gm_2 - 2*gds$$

$$gm_{3neu} = gm_3 - 2*gds$$

$$gm_{4neu} = gm_4 - 4*gds$$

Other such "compensation rules" can be established for other filters.

Further simplifications which are usually justified in practical application include the following:

$$gm_1 = gm_2 = gm_3 = gm_4 = gm \text{ (uniform transconductance value)}$$

$$C1 = C2 = C \text{ (uniform capacity)}$$

The result for the transmission function A(s) is then:

$$A = \frac{U_{out}}{U_{in}} = \frac{\frac{gm*(gm - 2*gds)}{C_1 * C_2}}{s^2 + \frac{gm}{C_1} * s + \frac{gm*(gm - 2*gds)}{C_1 * C_2}}$$

This transmission function A(s) provided with the invention is now only slightly dependent on the output resistance or the output admittance gds.

In order to be able to provide any filter characteristic desired, C1 and C2 may have to be designed differently (C1≠C2). This should then be taken into account with the new gm's. For the above-mentioned example of a biquad, the new gm's can advantageously e.g. be selected as follows:

$$gm_{2neu} = gm_2 - 2 * \frac{C_1}{C_2} gds$$

$$gm_{3neu} = gm_3 - 2 * gds$$

$$gm_{4neu} = gm_4 - 4 * \frac{C_1}{C_2} gds$$

The result for the transmission function A(s) is then:

$$A = \frac{U_{out}}{U_{in}} = \frac{\frac{gm*\left(gm - 2*\frac{C_1}{C_2}*gds\right)}{C_1 * C_2}}{s^2 + \frac{gm}{C_1} * s + \frac{gm*\left(gm - 2*\frac{C_1}{C_2}*gds\right)}{C_1 * C_2}}$$

Preferably, in the case of different capacitance C1, C2, the output admittance values should also be provided differently, in line with the former. Different output admittance values of gds on the one hand and 2*C1/C2*gds on the other hand can be obtained e.g. by corresponding scaling of the geometrical dimensions (e.g. channel lengths) of FET transistors in the output stages of the respective transconductance stages. The output admittance values can thus be specially selected (designed).

Figure 2A:
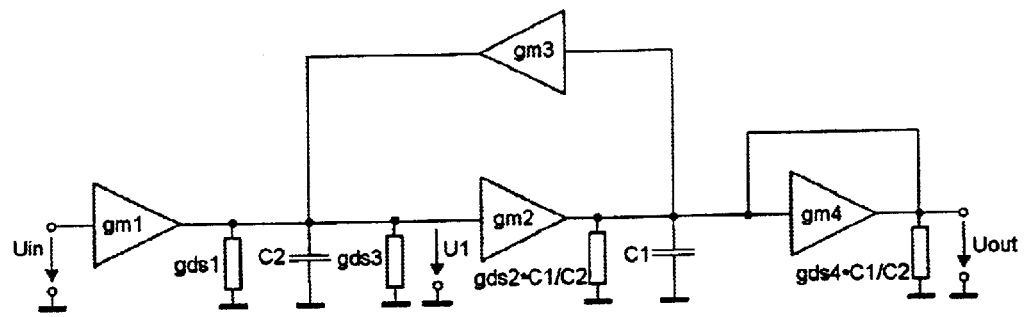
FIG. 2*a* a circuit diagram of the gm/C filter according to FIG. 1, wherein the output resistance values of the transconductance stages have been taken into account and have been selected specially.

FIG. 2a shows this design of new output admittance values gds2*C1/C2 and gds4*C1/C2 compared to the values gds2 and gds4 according to the original filter design.

Due to variations in the production process, this absolute value of the output admittance is subject to significant fluctuations in practical application. However, the relative ratio of one output admittance to another is very precise (typically approx. 0.5%). Within the context of the invention, the absolute value of the output admittance is of subordinate importance, since an adjustment takes place when the so-called main tuning of the filter is carried out. However, it is important that the output admittance values, which preferably are specially selected (e.g. so as to differ from each other), can be adjusted in a simple way, relative to each other, by scaling within the framework of production technology.

Figure 3:
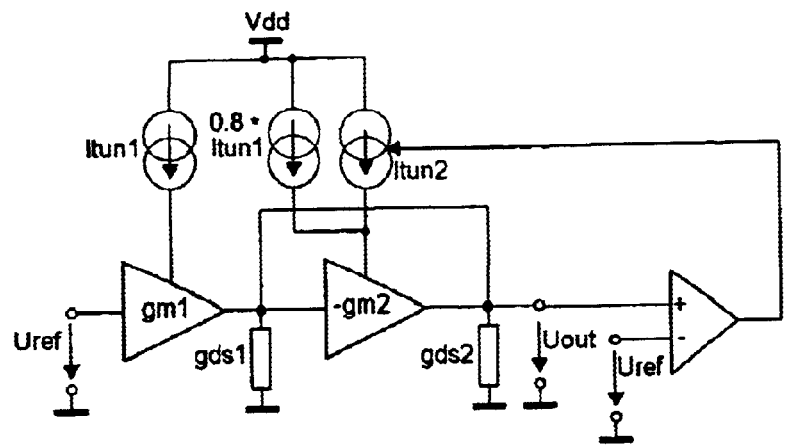
FIG. 3 a circuit diagram of the components of a tuning device, which components are important in the implementation of the invention in relation to the filter according to FIG. 2 or FIG. 2*a*.

FIG. 3 shows a simple implementation (tuning circuit) for generating the new transconductance values on replicas of the transconductance stages gm1 and gm2 used in the filter. The part shown (a closed-loop control circuit) of the tuning circuit is suitable for adjusting the filters shown in FIGS. 2 and 2a. Below, this is explained with reference to an example of an application for the filter according to FIG. 2.

Normally, with a gm/C filter there is a main tuning action which adjusts the time constant gm/C in relation to a very precise reference clock pulse (quartz). This circuit is not shown in FIG. 2. 100% (Itun) of the current from this circuit is supplied to the replicated gm1, while 80% is supplied to the replicated gm2. As shown in FIG. 3, the replicas gm1 and gm2 are arranged in series, with the input of the first transconductance stage gm1 constituting the input of the closed-loop control circuit, to which a preferably constant reference voltage Uref is applied. The output of the first transconductance stage gm1 is connected to the input of the further transconductance stage gm2 as well as to the output of the further transconductance stage gm2. This output of the further transconductance stage gm2 constitutes the output of the replica arrangement. In this arrangement, the replica gm2 shown is operated so as to be inverted ("−gm2"). The transconductance stages used in this arrangement usually comprise difference input stages and can be connected such that if a positive voltage is applied to the input, either the current flows from the output (normal operation) or he current flows in (inverted operation).

The output voltage Uout provided at the output is compared with the reference voltage Uref by means of a comparator. The comparison signal provided as a result of this comparison is fed as a control signal to an additional adjustable current source for the transconductance stage gm2, in order to adjust the bias current component supplied by this current source (in addition to 80% Itun). The closed-loop changes the current of gm2 until the output voltage equals Uref.

If in the steady state of the closed-loop control circuit shown in FIG. 3, Uout=Uref applies, then it can be shown that in this state the transconductance of the further transconductance stage gm2 differs from the transconductance of the first transconductance stage gm1 by the sum of the output admittance values gds1 and gds2:

$$gm2=gm1-(gds1+gds2)$$

If the condition gds1=gds2, which in practical application often needs to be met, applies, then this deviation thus amounts to twice the uniform output admittance:

$$gm2=gm1-2*gds$$

Thus, the part of the tuning device for the active filter, which part is shown in FIG. 3, at the replica of the further transconductance stage gm2 delivers exactly that bias current (=0.8*Itun1+Itun2) which, according to the above-mentioned compensation, is to be used directly or indirectly as the bias current for the transconductance stage gm2 of the filter according to FIG. 2.

An analogous view of the improved filter (specially selected capacitance and output admittance values) according to FIG. 2a, also shows that exactly that adjustment bias current which is required for the filter is supplied to the replica.

In order to obtain a deviation of four times an output admittance, e.g. two additional transconductance stage replicas can be used, an arrangement which differs from that shown in FIG. 3.

Alternatively, transconductance stage replicas with differing output admittance values can be used, e.g. with 1*gds on the one hand, and with 2*gds on the other hand. While the gds fluctuate absolutely during the process, they are relatively accurate in relation to each other, to typically approx. 1%. In other words, by means of corresponding ratios in the geometric dimensions of the transistors, the gds of the output stage of the transconductance stage can for example be adjusted precisely by the factor 2 in another output stage, even if, absolutely, they fluctuate considerably.

Figure 3A:
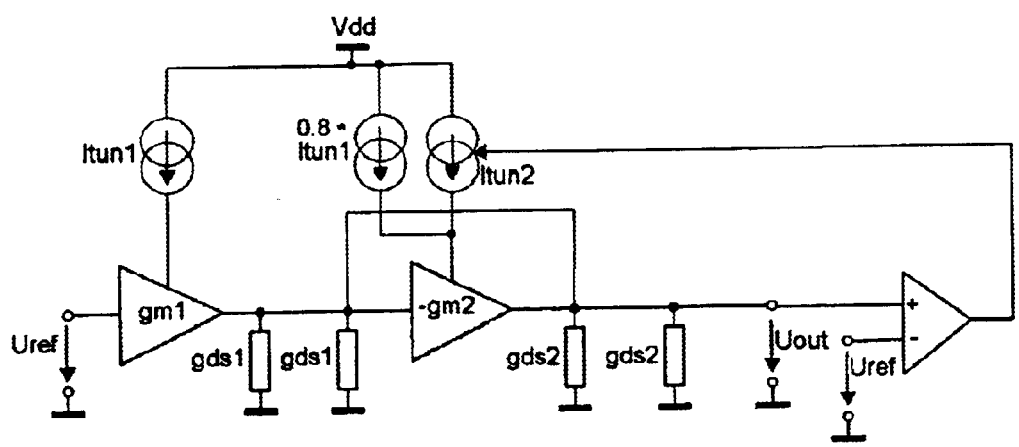
FIG. 3*a* a circuit diagram of the components of a tuning device, which components are important in an alternative implementation of the invention in the filter according to FIG. 2 or FIG. 2*a*.

FIG. 3a shows for example such an alternative circuit for adjusting the transconductance gm2=gm1−4*gds. In this arrangement, the halved output resistance of the transconductance stages gm1 and gm2 can be achieved either by changing (scaling) the output stage of gm1 and gm2 in a suitable way (reduction of the transistor lengths), or by connecting a second transconductance stage gm2 to the output node.

FIGS. 3 and 3a do not show the offset compensation (e.g. by means of a chopper amplifier) which due to the strong dependence of the tuning accuracy on offset voltages is absolutely necessary, with said offset compensation being known per se.

Depending on the concrete design of the active filter and compensation resulting therefrom, the average person skilled in the art can easily find circuits which are similar to the circuits according to FIG. 3 or 3a, with which circuits the deviations which are desired for compensation, and the new transconductance values respectively, can be adjusted.

In summary, the invention relates to an integrated circuit arrangement with an active filter comprising transconductance stages, each of which can be adjusted by means of a bias current which is to be supplied, and comprising a tuning device for tuning the filter, which tuning device adjusts the bias currents of the transconductance stages. This arrangement provides for the tuning device to adjust the bias current of a first transconductance stage for the purpose of achieving a desired characteristic of this transconductance stage, and in which the bias current of at least one further transconductance stage is adjusted such that the transconductance of this further transconductance stage deviates by a certain value from the transconductance of the first transconductance stage, wherein the bias current to be supplied for this purpose by the tuning device of the further transconductance stage is defined at a special closed-loop control circuit, which comprises an arrangement of replicas of at least the first transconductance stage and the further transconductance stage.

In this way, the effect which output resistance values of transconductance stages of the filter to be tuned have on the transmission function of this filter can be compensated for to a large extent.

What is claimed is:

1. An integrated circuit arrangement with an active filter comprising transconductance stages (gm1, gm2, gm3, gm4), each being adjustable by means of a bias current (Itun) to be supplied, and comprising a tuning device for tuning the filter, which tuning device adjusts the bias currents of the transconductance stages, wherein the tuning device adjusts the bias current (Itun1) of a first (gm1) transconductance stage, for the purpose of achieving a desired characteristic of this transconductance stage, and adjusts the bias current (0.8*Itun1+Itun2) of at least one further (gm2) transconductance stage such that the transconductance (gm2) of this further transconductance stage deviates from the transconductance (gm1) of the first transconductance stage by a value (2*gds) which corresponds to the sum of output admittance values (gds+gds), each of which output admittance values subject an output of the transconductance stages (gm1, gm2, gm3, gm4) to a load, wherein the bias current (0.8*Itun1+Itun2), which for this purpose is to be supplied by the tuning device to the further transconductance stage (gm2), is defined at a closed-loop control circuit, wherein the closed-loop control circuit comprises:

an arrangement of replicas of at least the first transconductance stage (gm1) and of the further transconductance stage (gm2);

current sources for supplying the first bias current (Itun1) to the replica of the first transconductance stage and a regulated further bias current (0.8*Itun1+Itun2) to the replica of the further transconductance stage;

a voltage source for applying an input voltage (Uref) to an input of the arrangement; and a comparator for comparing an output voltage (Uout) of the arrangement with the input voltage (Uref) and for providing a comparison signal which is supplied as a control signal to the current source of the replica of the further transconductance stage (gm2), in order to adjust the further bias current (0.8*Itun1+Itun2) such that the output voltage (Uout) becomes equal to the input voltage (Uref);

so that the further bias current (0.8*Itun1+Itun2) defines the current to be supplied by the tuning circuit to the further transconductance stage (gm2).

2. The circuit arrangement according to claim 1, wherein the active filter is a gm/C filter, in particular a biquad gm/C filter.

3. The circuit arrangement according to claim 1, constructed in CMOS technology.

4. The circuit arrangement according to claim 1, wherein the output admittance values of several of the transconductance stages are identical and wherein the tuning device adjusts the bias current of the further transconductance stages such that the transconductance of this further transconductance stage differs from the transconductance of the first transconductance stage by an integral multiple of this uniform output admittance.

5. The circuit arrangement according to claim 1, wherein the closed-loop control circuit comprises a series arrangement of replicas of the first transconductance stage and of the further transconductance stage, wherein the input of the first transconductance stage constitutes the input of the arrangement, wherein the output of the first transconductance stage is connected to the input of the further transconductance stage as well as to the output of the further transconductance stage, and wherein the output of the further transconductance stage constitutes the output of the arrangement.

6. The circuit arrangement according to claim 1, wherein the current source for supplying the regulated further bias current to the replica of the further transconductance stage comprises two current-source units with a parallel feed arrangement, with the first of these units supplying a bias current component which is at a fixed ratio to the first bias current, and wherein the comparison signal is supplied to the second unit for supplying a regulated bias current component.

7. A method for tuning an active filter of an integrated circuit arrangement by means of a tuning device of the integrated circuit arrangement, wherein the filter comprises transconductance stages, each of which is adjustable by means of a bias current to be supplied by the tuning device, with each output of the transconductance stages being subjected to a load by an output admittance, wherein the tuning device adjusts the bias currents of the transconductance stages, comprising the following steps:

a) adjusting the bias current of a first transconductance stage for the purpose of achieving a desired characteristic of this transconductance stage;

b) adjusting the bias current of at least one further transconductance stage, such that the transconductance of this further transconductance stage deviates from the transconductance of the first transconductance stage by a multiple of the output admittance;

c) defining the bias current which is to be supplied by the tuning device of the further transconductance stage at a closed-loop control circuit, wherein the closed-loop control circuit comprises:

an arrangement of replicas of at least the first transconductance stage and of the further transconductance stage;

current sources for supplying the first bias current to the replica of the first transconductance stage and a regulated further bias current to the replica of the further transconductance stage;

a voltage source for applying an input voltage to an input of the arrangement; and a comparator for comparing an output voltage of the arrangement with the input voltage and for providing a comparison signal which is supplied as a control signal to the current source of the replica of the further transconductance stage in order to adjust the further bias current such that the output voltage becomes equal to the input voltage;

d) the use of the further bias current defined in step c) as the bias current which is to be supplied to the further transconductance stage by the tuning device.

* * * * *